United States Patent [19]
Qadri et al.

[11] Patent Number: 5,800,934
[45] Date of Patent: Sep. 1, 1998

[54] ZINC OXIDE STABILIZED ZIRCONIA

[75] Inventors: Syed B. Qadri, Fairfax Station, Va.;
Earl F. Skelton, Washington, D.C.;
Peter Lubitz, Great Falls, Va.

[73] Assignee: The United States of America as represented by the Secretary of the Navy, Washington, D.C.

[21] Appl. No.: 806,375

[22] Filed: Feb. 27, 1997

[51] Int. Cl.⁶ .................. B32B 15/04; F01D 5/28

[52] U.S. Cl. .............. 428/633; 428/472; 416/241 B

[58] Field of Search ...................... 428/621, 632, 428/633, 472; 416/241 B

[56] References Cited

U.S. PATENT DOCUMENTS

| | | | |
|---|---|---|---|
| 3,410,728 | 11/1968 | Fullman et al. | 136/86 |
| 4,035,191 | 7/1977 | Johns | 106/57 |
| 4,248,940 | 2/1981 | Goward et al. | 428/633 |

*Primary Examiner*—John J. Zimmerman
*Attorney, Agent, or Firm*—Thomas E. McDonnell; George A. Kap

[57] ABSTRACT

Zinc oxide stabilized zirconia containing zirconia in cubic phase is prepared by evaporating zirconia and zinc oxide and depositing zirconia and zinc oxide on an atomic scale on a substrate. The stabilized zirconia resists corrosion at high temperatures above 1000° C., can be used as a part of a barrier coating, is transparent to visible light, and is electrically conducting.

6 Claims, No Drawings

ZINC OXIDE STABILIZED ZIRCONIA

BACKGROUND OF INVENTION

1. Field of Invention

This invention pertains generally to the field of stabilized zirconia, and more specifically to the field of thermally stabilized zirconia.

2. Description of Prior Art

Thermal barrier coatings provide thermal insulation to gas turbine engine hot-end components, such as blades and vanes. The application of ceramic coatings for thermal insulation significantly increases the efficiency and the power of the engine by lowering the temperature of the metal components while reducing engine fabrication costs by avoiding complex cooling schemes. Zirconia is the ceramic material that has been studied most extensively for thermal barrier coating applications.

The properties of zirconia that are attractive for thermal barrier coatings and other uses include high melting temperature, low thermal conductivity, high refractive index, hardness, corrosion barrier properties and a relatively high thermal coefficient of expansion to match expansion of the underlying superalloy substrate, if one is present. Its hardness and refractive index are close to that of diamond.

However, pure zirconia has a very serious drawback related to its high temperature phase stability. Depending on the temperature, zirconia has three distinct crystal structures. The cubic phase is stable at temperatures above about 2370° C. A tetragonal phase is stable between about 1150° C. and 2370° C. Below about 1150° C., the tetragonal phase transforms to a monoclinic phase through a martensitic transformation. This transformation is accompanied by a 3–6% volume expansion and the generation of shear strains due to distortion of the tetragonal crystal. The tetragonal-to-monoclinic transformation is troublesome for coating applications since it leads to coating disintegration and failure after only a few operating cycles.

Different approaches have been tried to stabilize zirconia. The most common and accepted method for phase stabilization is alloying zirconia ($ZrO_2$) with either yttria ($Y_2O_3$), ceria ($CeO_2$), magnesia ($MgO$) or alumina ($Al_2O_3$). At present time, yttria-stabilized zirconia is being evaluated for thermal barrier coating applications in gas turbine engine airfoils and other high temperature gas engines. The zirconia-based thermal barrier coating system used in turbine engine components is of a multilayer construction, with an MCrAlY (M=Ni, Co, or Fe) inner coating, known as the bond coat, on a superalloy substrate and yttria-stabilized zirconia outer coating. An alumina ($Al_2O_3$) scale forms at the interface between the MCrAlY and the yttria-stabilized zirconia layers during normal engine operation.

Failure of the thermal barrier system, often after only a few operating cycles, is often caused by cracks that develop between either the alumina scale and the yttria-stabilized zirconia coating or the scale and the bond coat. In addition to this mechanical failure mechanism, yttria is known to be subject to severe hot corrosion in the presence of salt, such as in a marine environment, and by sulfur and vanadium, which are common fuel contaminants. This hot corrosion process, leading to leaching of the yttria out of the yttria stabilized zirconia layer, effectively destroys the phase stabilization action of yttria.

SUMMARY OF INVENTION

An object of the present invention is to suppress the martenistic phase transformation and thus eliminate or reduce the volume change during phase transformation of zirconia between tetragonal and monoclinic phases.

Another object of the invention is to alleviate hot corrosion of a stabilized zirconia in a high temperature environment containing salt, sulfur and other components.

Another object of the invention is a corrosion resistant structure resistant to oxidation and having an extended life.

These and other objects of this invention are accomplished by a structure having a zinc oxide stabilized zirconia coating thereon wherein the zirconia is stabilized in the cubic phase, stabilization being accomplished by evaporating and depositing zirconia and and zinc oxide on a substrate by means of physical vapor deposition.

DESCRIPTION OF PREFERRED EMBODIMENTS

This invention pertains to zirconia stabilized with zinc oxide and to a process for making same. The present invention depends on geometric constraint and on grain boundary pinning for stabilizing zirconia in the cubic phase. Geometric constraint is provided by combining zirconia with another material that is insoluble in zirconia and vice versa and has a high elastic modulus.

In preparing stabilized zirconia pursuant to this disclosure, pellets of zirconia and zinc oxide are placed in separate electron gun hearths in an electron beam evaporating apparatus. The apparatus is contained in an evacuated chamber and held at a vacuum. The vacuum initially is high at about $10^{-10}$ mm of mercury but deteriorates somewhat to about $10^{-5}$ mm of mercury during deposition. The rate of evaporation of zirconia pellets and zinc oxide pellets is adjusted by the deposition rate controllers to obtain the desired atomic ratio of zirconium and zinc in the final product. A quartz crystal monitor can be used to assess the flux at the substrate. For stabilized zirconia, the deposition rate for zinc in the form of zinc oxide is 1–2 Å/sec and for zirconium in the form of zirconia it is 1–8 Å/sec. Once the rate is set, the shutters are opened for deposition on a substrate.

Although any substrate can be used which can withstand the high temperature and which is chemically resistant, the preferred substrates include any high temperature alloy, such as MCrAlY where M is cobalt, nickel or iron; metals; and quartz. During deposition, the substrate is maintained at an elevated temperature of about 200°–400° C., although this is not absolutely necessary. Maintaining the substrate at an elevated temperature assures deposition of a crystalline stabilized zirconia. Maintaining the substrate at room temperature will result in an amorphous coating which can be converted to crystalline by annealing.

Stabilized zirconia can be produced with coatings typically having zirconium:zinc atomic percent varying from 99:1 to 50:50, more typically from 90:10 to 40:60. This stabilized zirconia is in cubic phase as revealed by x-ray diffraction.

It is not necessary to deposit zirconia and zinc oxide by physical vapor deposition, such as electron beam evaporation. Any means can be used, such as plasma spraying, where deposition of zirconia and zinc oxide is effected on an atomic scale which results in a dense material having fine micro structure and low pinhole density. Low porosity and an absence of pinholes in the material contribute to corrosion resistance of the material.

After depositing a coating of desired thickness on a suitable substrate, deposition of zirconia and zinc oxide is terminated and the substrate, with the coating thereon, is slowly cooled to ambient temperature. This cooling typically takes less than 5 hours, more typically several minutes to about 3 hours. Although the stabilized zirconia can be in a free-standing form, typically it is used as a coating.

When depositing zinc oxide and zirconia, it is not necessary to have zirconia in any particular phase to achieve phase stabilization, as disclosed herein. When deposited with zinc oxide, zirconia can be in cubic, tetragonal or monoclinic phases, although typically, zirconia at room temperature is in the monoclinic phase.

If it is desired to provide a protective coating of stabilized zirconia for use in a high temperature and possibly corrosive environment, then deposition is made over a desired substrate. The stabilized zirconia is typically deposited on a MCrAlY bond coat where M is cobalt, nickel, or iron. The bond coat is typically 0.08–0.2 mm thick and comprises on a weight basis, 15–35% chromium, 5–13alumina 0–1% yttrium, and the balance cobalt, nickel or iron. The bond coat protects and is disposed over a superalloy substrate, such as nickel or a cobalt superalloy.

Stabilization of zirconia, as disclosed herein, is believed to be achieved by the effect of geometric constraint. It is known that the tetragonal to monoclinic phase transformation of unconstrained zirconia does not take place if grain or particle size of zirconia is below about 17 nanometers. The problem with this fact is that upon even a mild heat treatment, the grain size can increase several fold and heat treatment at an elevated temperature can increase the orginal grain size hundreds of times. The presence of zinc oxide geometrically constrains, or grain boundary pins, the expansion of a zirconia grain thus minimizing growth of zirconia grains during high temperature service.

The stabilized zirconia coating in a thermal barrier coating system should be as thin as possible since a thin coating is less prone to cracking than thicker coatings and it is cheaper since less material is used. However, a thick coating, although more expensive, provides more thermal and chemical protection to the underlying substrate and allows operation at a higher temperature since the underlying substrate experiences a lower temperature. Since thermal conductivity of zinc oxide at high temperatures is about the same as that of zirconia, it is as effective as zirconia as a thermal barrier, which means that the thermal barrier coating thickness should be reduced compared to other stabilized zirconia thermal barrier coatings. Balancing these prerogatives, thickness of the stabilized zirconia coating of this invention is typically about the same as the more common prior art stabilized zirconia coatings where zirconia is stabilized with yttria or ceria. In terms of specific parameters, thickness of the stabilized zirconia coatings of this invention is typically up to about 300 microns, more typically about 10–100 microns.

The stabilized zirconia of this invention is particularly important for thermal barrier applications in the hot end components of turbine engines for aircraft, surface ships, submarines, and land-based power generating plants. However, the stabilized zirconia can be used in any freestanding form or as a coating application where high temperatures with or without corrosion environment, are encountered.

Zirconia stabilized with zinc oxide is also resistant to corrosion. This property is of particular benefit where the fuel or air used contains corrosive components. This includes applications where low cost fuels are used, as in turbine engines, which fuels contain corrosive impurities such as sulfur and vanadium, or where air is used, as in carrier-based jet planes, which air contains corrosive components from seawater. Since zinc oxide does not react with sulfates and vanadates and is a good protector against wet, hot corrosion, by stabilizing the high temperature phase of zirconia with an equally good corrosion material, such as zinc oxide, an advantage is achieved. The advantage is two-fold and includes stabilization of zirconia in the cubic form and realization of a superior composite chemical barrier. Therefore, zirconia-zinc oxide materials and coatings should far outperform other zirconia stabillized materials and coatings.

Corrosion resistance of the stabilized zirconia is partly based on the particle size of zirconia. Particle size of zirconia in zirconia stabilized with zinc oxide was obtained for various coatings having varying atomic ratios of zirconium to zinc by first examining the coatings by x-ray diffraction and then calculating the particle sizes from the peaks obtained from the diffraction scans of each sample. Particle size and lattice parameters of unit cells are given below in Table I:

TABLE I

| Zr:Zn Atomic Ratio | Lattice Parameter (Å) | Particle Size (Å) |
|---|---|---|
| 70:30 | 5.1046 ± 0.0007 | 205 ± 8 |
| 60:40 | 5.1080 ± 0.0008 | 65 ± 4 |
| 50:50 | 5.1009 ± 0.0006 | 70 ± 4 |
| 40:60 | 5.0987 ± 0.0006 | 75 ± 5 |

The small particle sizes given in Table I are indicative of the fact that the coatings are dense thus resulting in coatings that have fine micro structure and low pinhole density. Such coatings have better corrosion and thermal resistance than coatings with course structure and high pinhole density. It presently appears that the lattice parameters given in Table I do not impact the stabilized zirconia.

The x-ray diffraction scans of the coatings revealed the presence of cubic phase of zirconia. No diffraction peaks corresponding to zinc oxides were seen in the diffraction scans. This suggests that zinc oxide particles are finely dispersed in the zirconia matrix and are amorphous or, if crystalline, below minimum detection limit.

Zirconia stabilized with zinc oxide can also be used in applications where optical properties of the material are of concern. Optical applications where zirconia stabilized with zinc oxide are of paramount suitability include aircraft and missile canopies, radar domes, scratch-free lenses, etc.

Other applications where the stabilized zirconia is particularly suitable is where there is a need for a material having attributes of zirconia stabilized with zinc oxide, including electrical conductivity. Myriad applications for such a materials exist, including coatings of transparent materials which become covered with fog. Since the stabilized zirconia is electrically conducting, the fog can be dissipated by application of electrical energy, such as resistive heating, to such a coating. With the stabilized zirconia, electrical conductivity increases with temperature.

Having described the invention, the following examples are given as particular embodiments thereof and demonstrate the practice and advantages thereof. It is understood that the examples are given by way of illustration and are not intended to limit the specification or the claims in any manner.

EXAMPLE 1

This example demonstrates stabilization of zirconia against phase transformation that takes place between tetragonal and monoclinic phases which, in absence of stabilization, is accompanied by a 3–6% volume change.

Zirconia and zinc oxide pellets were placed in seperate electron-gun hearths in an electron-beam evaporating system and separate electron beams were trained on zirconia and zinc oxide to vaporize same. About 1 KW of electrical energy was used to vaporize zirconia and about 1 KW of electrical energy was used to vaporize zinc oxide. Calculated vaporization temperature of zirconia is about 5000° C. and its melting temperature is 2700° C. No calculated vaporization temperature for zinc oxide appears to be available although its melting temperature is 1975° C. The system was contained in a closed chamber evacuated to a vacuum of $10^{-10}$ Torr or mm of mercury. The rate of evaporation was adjusted by the deposition rate controllers to obtain atomic ratio of zirconium in the form of zirconia to zinc in the form of zinc oxide of 90 to 10 in the final product. A quartz crystal monitor was used to assess the flux at the substrate. The substrate was a quartz square which was maintained at 300° C. and it measured 1 cm on a side and 2 mm thick. Deposition rate for zinc oxide was set at 1 Å/second and that for zirconia was 8 Å/second. After the rate was set, the shutters were opened for deposition on the quartz substrate.

During deposition of the stabilized zirconia, vaporized molecules of zirconia and vaporized molecules of zinc oxide mixed in the overhead space and deposited on the substrate. The substrate was positioned above the zirconia and zinc oxide sources so that the coating was disposed above the overhead space and molecules of zirconia and zinc oxide deposited on the substrate by virtue of kinetic energy that they possessed.

Deposition of zirconia and zinc oxide was continued for about one hour and then the coated substrate was slowly cooled to room temperature in about 2 hours by cutting electricty to the vapor deposition apparatus. Thickness of the stabilized zirconia coating at room temperature was 1 micron.

Chemical composition was confirmed by energy dispersive x-ray fluorescence techniques. The crystal structure parameters were determined using standard x-ray diffraction with a Rigaku rotating anode x-ray generator with a copper target and a powder diffractometer. Spectroscopic ellipsometry measurement was performed on an automatic rotating analyzer ellipsometer and the refractive index was obtained using nonlinear regression analysis. Electrical resistivity at room temperature was very high but was nearly zero at 1000° C.

Zirconia in the stabilized zirconia was in cubic phase and the stabilized zirconia coating had refractive index of 2.0, was resistant to high temperature corrosion, could be used as a thermal barrier coating and had electrical resistivity of nearly zero at 1000° C. The stabilized zirconia coating was expected to be stable for over 2200 hours at 1000° C.

While presently preferred embodiments have been shown of the invention disclosed herein, persons skilled in this art will readily appreciate that various additional changes and modifications can be made without departing from the spirit of the invention as defined and differentiated by the following claims.

What is claimed is:

1. An article comprising a substrate and an outer layer disposed on and adhering to said substrate; said outer layer comprising stabilized zirconia in cubic form, said stabilized zirconia is in cubic form and consists essentially of zirconia and zinc oxide in atomic ratio from 99:1 to 50:50 zirconium to zinc wherein zirconium is in the form of zirconia and zinc is in the form of zinc oxide.

2. The article of claim 1 wherein atomic ratio of zirconium as zirconia to zinc as zinc oxide in said stabilized zirconia is from 90:10 to 40:60 and wherein thickness of said outer ceramic layer is 10–100 microns.

3. The article of claim 1 wherein thickness of said outer ceramic layer is up to about 300 microns.

4. A structure comprising an outer ceramic layer disposed over and in physical contact with a bond coat of MCrAlY where M is selected from the group consisting essentially of cobalt, nickel, iron, and mixtures thereof; said outer layer consisting essentially of zinc oxide stabilized zirconia in cubic form with atomic ratio of zirconium as zirconia to zinc as zinc oxide of from 99:1 to 50:50.

5. The structure of claim 4, wherein atomic ratio of zirconium as zirconia to zinc as zinc oxide in the stabilized zirconia is from 90:10 to 40:60.

6. The structure of claim 4 including a superalloy disposed below and adhering to said bond coat, said outer layer and said bond coat constituting a thermal barrier coat, thickness of said outer layer is 10–100 microns.

* * * * *